(12) United States Patent  
Boatner et al.

(10) Patent No.: US 8,258,483 B1  
(45) Date of Patent: Sep. 4, 2012

(54) HIGH SPATIAL RESOLUTION PARTICLE DETECTORS

(75) Inventors: Lynn A. Boatner, Oak Ridge, TN (US); John T. Mihalczo, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/101,741

(22) Filed: May 5, 2011

(51) Int. Cl.
  *G01T 3/06* (2006.01)
  *G01T 1/20* (2006.01)
  *G01N 23/09* (2006.01)

(52) U.S. Cl. .................................. 250/390.11; 250/367

(58) Field of Classification Search ............ 250/390.11, 250/367
  See application file for complete search history.

(56) References Cited

U.S. PATENT DOCUMENTS

| | | | |
|---|---|---|---|
| 5,168,540 A | 12/1992 | Winn et al. | |
| 5,264,702 A * | 11/1993 | Mihalczo | 250/390.11 |
| 5,289,510 A | 2/1994 | Mihalczo | |
| 5,434,415 A | 7/1995 | Terada et al. | |
| 5,606,167 A * | 2/1997 | Miller | 250/390.04 |
| 6,060,713 A | 5/2000 | Skillicorn et al. | |
| 6,087,666 A | 7/2000 | Huston et al. | |
| 7,105,832 B2 | 9/2006 | Dai et al. | |
| 7,288,771 B2 | 10/2007 | Neal et al. | |
| 7,372,041 B1 * | 5/2008 | Nagarkar et al. | 250/390.11 |
| 7,538,329 B2 | 5/2009 | Chen et al. | |
| 7,582,880 B2 | 9/2009 | Wallace et al. | |
| 2005/0236577 A1 | 10/2005 | Katagiri | |
| 2006/0049345 A1 * | 3/2006 | Rao et al. | 250/269.1 |
| 2007/0085010 A1 | 4/2007 | Letant et al. | |
| 2008/0156997 A1 * | 7/2008 | Kearfott | 250/390.04 |
| 2008/0210880 A1 * | 9/2008 | Baroni et al. | 250/390.11 |
| 2010/0111487 A1 * | 5/2010 | Aitken et al. | 385/141 |

FOREIGN PATENT DOCUMENTS

| | | |
|---|---|---|
| JP | 9-184884 | 7/1997 |
| WO | WO 2005/103759 | 11/2005 |

* cited by examiner

*Primary Examiner* — Constantine Hannaher
(74) *Attorney, Agent, or Firm* — Klarquist Sparkman, LLP

(57) ABSTRACT

Disclosed below are representative embodiments of methods, apparatus, and systems for detecting particles, such as radiation or charged particles. One exemplary embodiment disclosed herein is particle detector comprising an optical fiber with a first end and second end opposite the first end. The optical fiber of this embodiment further comprises a doped region at the first end and a non-doped region adjacent to the doped region. The doped region of the optical fiber is configured to scintillate upon interaction with a target particle, thereby generating one or more photons that propagate through the optical fiber and to the second end. Embodiments of the disclosed technology can be used in a variety of applications, including associated particle imaging and cold neutron scattering.

31 Claims, 8 Drawing Sheets

HIGH SPATIAL RESOLUTION PARTICLE DETECTORS

ACKNOWLEDGMENT OF GOVERNMENT SUPPORT

This invention was made with government support under Contract No. DE-AC05-00OR22725 awarded by the U.S. Department of Energy. The government has certain rights in the invention.

FIELD

The present application concerns particle detectors having high spatial resolution. The particle detectors can be used, for example, in associated particle imaging or cold neutron scattering applications.

BACKGROUND

Particle detectors have a wide variety of applications and functions. In radiation imaging systems, for example, particle detectors are often used to not only detect the presence of particles incident with the face of the detector, but also to identify the spatial position on the face where the interaction occurred and in some cases the energy of the particle. This spatial information can then be used as part of the image reconstruction process. In associated particle imaging ("API") applications, for instance, an alpha particle detector is used to "tag" an alpha particle with an associated neutron in both space and time. To increase the efficiency and accuracy with which associated neutrons are tagged, faster alpha particle detectors with higher spatial resolution are desired. High spatial resolution particle detectors are also desirable for use in other contexts, such as cold neutron and other neutron scattering experiments.

SUMMARY

Disclosed below are representative embodiments of methods, apparatus, and systems for detecting particles, such as radiation or charged particles, with high spatial resolution. The disclosed embodiments should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

One of the exemplary embodiments disclosed herein is a particle detector comprising an optical fiber having a first end and second end opposite the first end. In this embodiment, the optical fiber comprises a doped region at the first end and a non-doped region adjacent to the doped region, the doped end region of the optical fiber being configured to scintillate upon interaction with a target particle, and to thereby generate one or more photons that propagate through the optical fiber to the second end. By having the scintillation region integrated into the fiber, the light output of the fiber can be increased. The target particle can be an alpha particle, a beta particle, another charged particle, a neutron, or other radiation or particle that interacts in the first end of the fiber and produces photons. In certain implementations, the particle detector further comprises a photomultiplier communicatively coupled to the optical fiber, the photomultiplier being configured to convert the one or more photons into an electrical signal. The photomultiplier can be communicatively coupled to the optical fiber via a light guide or via a direct coupling. In some implementations, the optical fiber is a first optical fiber and the particle detector further comprises one or more additional optical fibers, the one or more additional optical fibers also having doped regions at respective first ends and non-doped regions adjacent to the doped regions. In these implementations, the doped regions of the additional optical fibers are also configured to scintillate upon interaction with the target particle, and to thereby generate one or more photons that propagate to respective second ends of the additional optical fibers. Further, the first optical fiber and the additional optical fibers are arranged to form a detection surface for detecting a spatial position at which interaction with the target particle occurs. A pixelated photomultiplier can be communicatively coupled to the first optical fiber and the additional optical fibers, the pixelated photomultiplier being configured to convert the one or more photons into an electrical signal, the electrical signal being further indicative of which one of the first optical fiber and the additional optical fibers interacted with the target particle. In certain implementations, the particle detector further comprises a coating deposited over the first end of the optical fiber, the coating being configured to block transmission of one or more untargeted particles. The coating can be aluminum and have a thickness of 2 microns or less. In other implementations, however, the coating has a thickness greater than 2 microns. In general, the coating can be selected to have a thickness that permits transmission of the target particle and for thicker coatings reflects photons generated in the scintillation region of the optical fiber. In some implementations, the depth of the doped region at the first end of the optical fiber is 50 microns or less. In other implementations, however, the depth is greater than 50 microns. In certain implementations, the dopant of the doped region at the first end of the optical fiber is one of cerium, europium, or praseodymium, and the target particle is an alpha particle. In such implementations, the depth of the doped region is 20 microns or less. In some implementations, the dopant of the doped region at the first end of the optical fiber also contains lithium or boron if the target particle is a cold neutron. The lithium or boron is preferably in the form of isotopically enriched lithium six or boron ten in order to enhance the detection of neutrons. In such implementations, the depth of the doped region can be between 20 and 100 microns. In some implementations, the doped region includes multiple dopants, such as a first dopant that interacts with a target particle and produces a secondary particle (e.g., a dopant that creates an alpha particle upon interaction with a neutron, such as one of lithium or boron) and a second dopant that interacts with the secondary particle and produces a photon (e.g., a dopant that interacts with an alpha particle or other reaction product, such as one of cerium, europium, or praseodymium).

Also among the disclosed embodiments is a method for manufacturing partially doped optical fibers. In one example method, end portions of one or more optical fibers are partially doped with one or more doping agents, the one or more doping agents being selected to generate light at the partially doped end portions when the one or more doping agents are activated by a target particle. An annealing process is performed on at least a portion of the partially doped end portions of the one or more optical fibers. A coating is then deposited over the end portions of the one or more optical fibers. In certain implementations, the coating is formed of a material (e.g., aluminum) by using physical vapor deposition, chemical deposition, or other coating methods to form a coating that blocks transmission of one or more untargeted particles. The act of partially doping the end portions can comprise implanting ions into the end portions of the one or more optical fibers, and varying an implantation energy so that the implanted ions have a depth in the end portions of the one or more optical fibers selected to scintillate with the target particle. In such implementations, the ions can be one or more of cerium ions, europium ions, or praseodymium ions, and the depth can be selected to scintillate with an alpha particle or to produce other reaction products resulting from an interaction with a neutron. For such implementations, the depth of doping can be 20 microns or less. In other implementations, the act of partially doping the end portions comprises diffusing ions into the end portions of the one or more optical fibers to a depth selected to interact with the target particle. In such implementations, the ions can be one or more of lithium ions or boron ions, and the target particle can be a neutron. For such implementations, for alpha detectors, the depth can be 20 microns or less.

Another embodiment disclosed herein is a neutron radiography system comprising a neutron source, one or more neutron detectors positioned to detect at least some of the neutrons generated by the neutron source, an interrogation region located between the neutron source and the one or more neutron detectors, and an alpha particle detector configured to detect alpha particles associated with neutrons generated by the first neutron source. In this embodiment, the alpha particle detector comprises one or more alpha particle scintillation regions integrally formed within a corresponding one or more light transmission elements. In certain implementations, the one or more light transmission elements comprise optical fibers, and the alpha particle scintillation regions comprise doped end portions of the optical fibers. In some implementations, a majority of the bodies of the optical fibers are undoped. In certain implementations, the doped end portions are doped with one or more of cerium, europium, or praseodymium. In some implementations, the alpha particle detector has a spatial resolution of 100 microns or less. In certain implementations, the alpha particle detector has a timing resolution of 2 nanoseconds or less. In some implementations, the alpha particle detector further comprises a coating configured to prevent transmission of light and scattered accelerated particles in the generator to the scintillation regions. In certain implementations, the alpha particle detector does not include a scintillating element separable from the one or more light transmission elements. In some implementations, the system further comprises a pixelated photomultiplier communicatively coupled to the light transmission elements of the alpha particle detector and configured to convert light from the one or more light transmission elements into electrical signals, the electrical signals being indicative of which one of the one or more light transmission elements was activated by a target particle. In such implementations, the pixelated photomultiplier can be communicatively coupled to the light transmission elements through a light guide or a direct coupling.

A further embodiment disclosed herein is a neutron scattering system comprising a neutron source, a scattering target positioned in a path along which neutrons from the neutron source travel, and one or more neutron detectors positioned to detect one or more scattered neutrons scattered by the scattering target. In this embodiment, the one or more neutron detectors comprise light transmission elements having partially doped end portions, and the partially doped end portions comprise one or more dopants selected to interact with an incident scattered neutron and thereby generate a photon. In certain implementations, the one or more dopants comprise a first dopant selected to generate a secondary particle upon interaction with the incident neutron, and a second dopant selected to generate a photon upon interaction with the secondary particle. For instance, the first dopant can be one or more of lithium-6 or boron-10, and the second dopant can be one or more of cerium, europium, or praseodymium. In some implementations, the majority of the bodies of the light transmission elements are undoped. In certain implementations, the partially doped end portions of the light transmission elements are covered by a coating (e.g., aluminum) that permits transmission of neutrons and reflects photons generated within the bodies of the light transmission elements.

The foregoing and other objects, features, and advantages of embodiments of the invention will become more apparent from the following detailed description, which proceeds with reference to the accompanying figures.

BRIEF DESCRIPTION OF THE DRAWINGS

In FIG. 2, the APNR system is illustrated as interrogating a metal pipe concealing a puck-shaped plastic object with a central hole.

DETAILED DESCRIPTION

I. General Considerations

Figure 1:
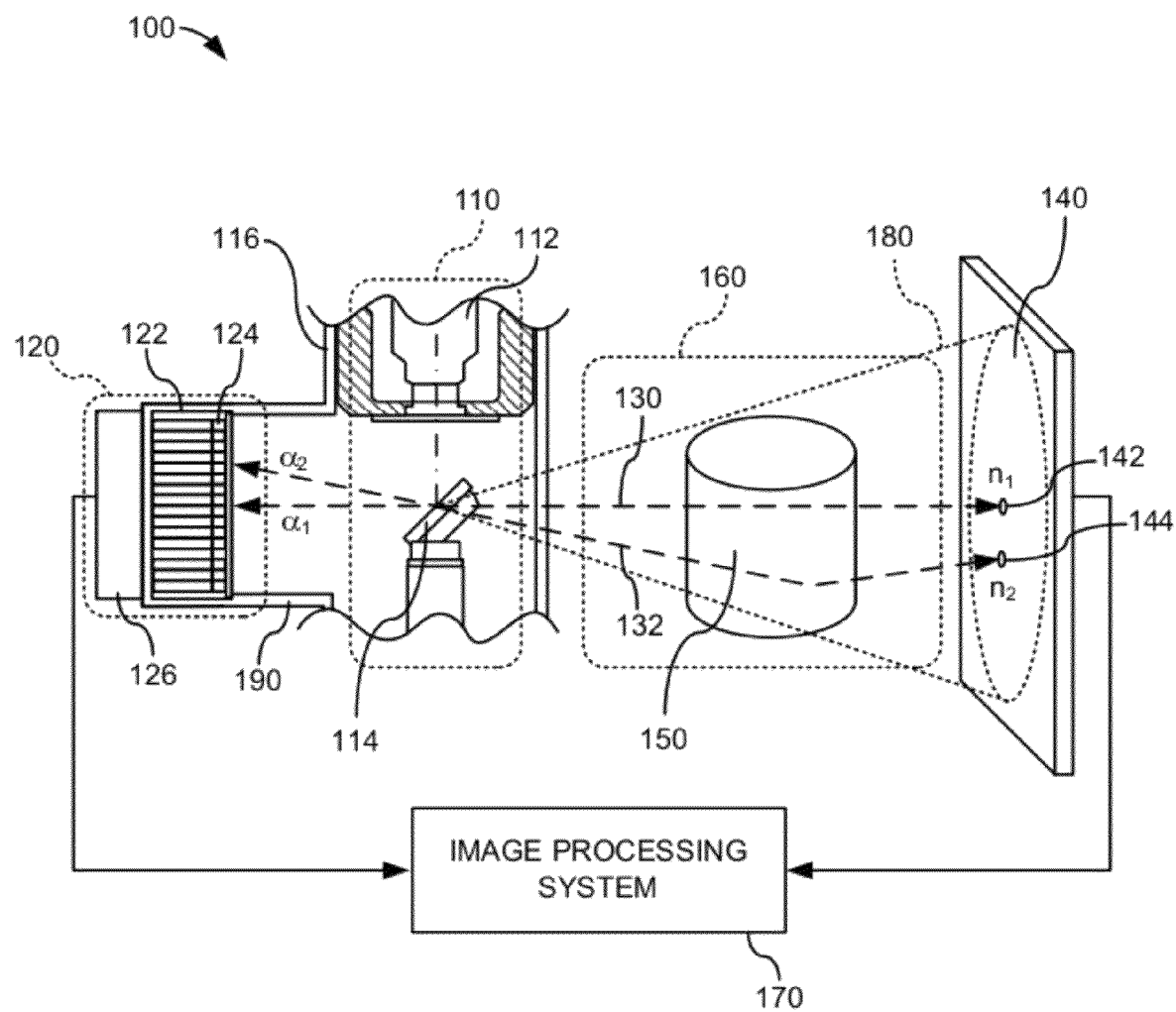
FIG. 1 is a schematic block diagram of an associated particle neutron radiography ("APNR") system using an embodiment of the disclosed technology as an alpha particle detector.

Disclosed below are representative embodiments of methods, apparatus, and systems for detecting particles, such as radiation or charged particles. The disclosed methods, apparatus, and systems should not be construed as limiting in any way. Instead, the present disclosure is directed toward all novel and nonobvious features and aspects of the various disclosed embodiments, alone and in various combinations and subcombinations with one another. Furthermore, any features or aspects of the disclosed embodiments can be used in various combinations and subcombinations with one another. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems.

II. Associated Particle Imaging

Exemplary embodiments of the disclosed particle detectors are particularly well suited for use as an alpha particle detector in an associated particle imaging ("API") system. Accordingly, this section provides a description of API and exemplary API systems in which the disclosed particle detectors can be used.

In general, API involves "tagging" a neutron emission in time, direction, or both time and direction by detecting a particle that is associated with the creation of a neutron. For example, embodiments of the disclosed technology use a deuterium-tritium generator as a neutron source. The deuterium-tritium generator produces monoenergetic neutrons (sometimes designated herein as "n" particles) and alpha particles (sometimes designated herein as "$^4$He" or "$\alpha$" particles) that travel in nearly opposite directions from one another. By detecting the arrival of an alpha particle and its position (e.g., in two dimensions) at an alpha particle detector located in a known geometry from the neutron source, the time and/or direction of the neutron emission can be determined. Although the direction of travel of the neutron is not exactly opposite of its associated alpha particle, the direction of travel is fixed and can be predicted accurately after accounting for the momentum of the particles in the deuterium beam. Accordingly, the direction of travel of the neutron can be determined accurately from the detected position of its associated alpha particle. In this way, the alpha particle can be used to "tag" the neutron emission. Further, because the time-of-flight of the neutron is fixed in a system that has a known geometry and that produces monoenergetic neutrons, a neutron detected at an array of neutron detectors positioned distally from the neutron source can be positively identified as the "tagged" neutron if it arrives in the expected time window and at an expected position at the detectors.

Furthermore and as more fully explained below, embodiments of the disclosed technology use a transmission imaging approach. In particular, images of an interrogated object are generated based on the number of detected neutrons that are transmitted through the interrogated object without scattering or causing fission with nuclei in the interrogated object. The resulting images can be generated, for example, by normalizing the detected counts in the neutron detector to those produced by the system when no object is present in the system.

The combination of API with transmission imaging is sometimes referred to herein as associated particle neutron radiography ("APNR"). The use of time and direction tagging allows embodiments of the APNR system to effectively remove measurement noise resulting from scattered neutrons (this technique is sometimes referred to as "electronic collimation"). The elimination of scattered neutrons enables high-contrast images to be generated, even through thick objects (e.g., large cargo containers), without the need for any physical collimation or shaping of the neutron beam. Thus, embodiments of the APNR system can be free of a physical collimator. The elimination of the need for physical collimation also enables wide cone-beam imaging without compromising image contrast. With wide cone-beam imaging, two-dimensional arrays of neutron detectors can be used, thus allowing the system to detect and use many more neutrons during the imaging process than is possible with conventional fan-based imaging. This ability to collect data in two dimensions also compensates for any loss in imaging capability that results from using an associated particle imaging technique. Additionally, wide cone-beam imaging and the absence of a physical collimator also enables the neutron source to be positioned close to the interrogated object, resulting in a compact geometry that requires less shielding overall. The overall footprint for embodiments of the APNR system can therefore be much smaller and lighter than conventional systems. Furthermore, APNR allows multiple neutron sources to be used (e.g., to be used simultaneously) during the neutron interrogation and image generation process. Consequently, multiple projection images from different angles can be generated simultaneously, significantly accelerating the image capture and reconstruction process (e.g., using computed tomography techniques, such as a filtered back projection technique).

FIG. 1 is a schematic block diagram of an exemplary APNR configuration 100 in which an embodiment of the disclosed technology is used as an alpha particle detector. In general, the configuration 100 illustrates the basic components used to perform APNR using a single neutron source. Additional neutron sources can also be used.

In FIG. 1, a neutron source 110 generates neutrons that interrogate an object 150 and that are detected by an array of neutron detectors 140. In the illustrated embodiment, the neutron source 110 is a portable deuterium-tritium ("DT") generator. In other embodiments, however, other neutron sources are used (e.g., other monoenergetic neutron generators, such as a deuterium-deuterium generator, or a non-monoenergetic Californium neutron source, or any other neutron source). The DT generator illustrated in FIG. 1 includes a deuterium accelerator 112 that produces a deuterium beam that strikes a tritium-impregnated target 114 at a fixed location in the generator (sometimes referred to as the "neutron production spot"). In other embodiments, however, a tritium beam can strike a deuterium-impregnated target, or a mixed deuterium-tritium beam can strike a mixed deuterium-tritium target. The resulting interaction in the illustrated embodiment produces a monoenergetic neutron (e.g., a 14.1 MeV neutron) and an alpha particle (e.g., a 3.5 MeV alpha particle):

$$d + t \rightarrow n + {}^4\text{He}. \tag{1}$$

In the illustrated configuration, the deuterium accelerator 112 and the tritium-impregnated target 114 are located in fixed positions inside a sealed tube 116. With this configuration, the source of the neutrons can be considered to be the location of the tritium-impregnated target 114 that interacts with the deuterium beam. In certain embodiments, for instance, the neutron production spot size of the target (and thus the size of the source) is reduced or minimized so that the paths of the generated neutrons can be determined with higher accuracy. Also, because of the penetrating power of neutrons, the sealed tube 116 need not have any physical window or other aperture for emitting the neutrons. In the illustrated embodiment, the total neutron emissions from the neutron source 110 are roughly isotropic.

The configuration 100 further includes an alpha particle detector 120. In the illustrated embodiments, the alpha particle detector 120 comprises a fiber optic face plate 122 formed from multiple fibers that have been partially doped to create a scintillation region 124 at one end of the fibers inside the generator. In this way, the fiber optic plate itself includes a scintillation material. Furthermore, the illustrated fiber optic face plate 122 is coupled to a fast, position-sensitive photomultiplier tube 126 configured to detect activation of one or more of the scintillation fibers in the fiber optic plate and generate a corresponding electrical signal representative of the location on the scintillation surface of the fiber optic face plate 122 where activation occurred. In the illustrated embodiment, the fiber optic face plate 122 is located internally within a sealed tube 190 of the APNR configuration 100, whereas the photomultiplier tube 126 is located externally. Thus, the two components are separated by a small gap, which can be filled with an optical coupling jelly. In other embodiments, however, both the fiber optic face plate 122 and the photomultiplier tube 126 are located internally within the tube 190. Furthermore, and as more fully explained below, a light guide or an extended bundle of fiber optic wires can be used to couple the fiber optic face plate 122 to the photomultiplier tube 126. Embodiments of the fiber optic face plate operate with a high timing resolution (e.g., 10 ns or less, 3 ns or less, or 1 ns or less) and thus improve the ability of the APNR configuration to discriminate between neutrons generated at different times. Embodiments of the fiber optic face plate also operate with high spatial resolution (e.g., 100 microns or less) and thus improve the precision with which an alpha particle path and neutron path can be determined. Additional details of exemplary embodiments of the fiber optic face plate 122 are described below with respect to FIGS. 6 and 7.

The configuration 100 additionally comprises an array of neutron detectors 140 positioned distally from the neutron source 110. In the illustrated embodiment, the neutron detectors comprise position-sensitive two-dimensional neutron "block detectors." Each neutron block detector can comprise any number of detectors in any arrangement (e.g., 10×10 arrays). The illustrated detectors are coupled to a plurality of photomultiplier tubes whose shared response can be used to determine the position on the array where the neutron interaction actually occurred. In other embodiments, other suitable neutron detectors are used (e.g., plastic scintillators, proton recoil scintillators, or other such fast neutron detectors). Furthermore, the timing resolution of the detectors is desirably high (e.g., a rise and decay time of 10 ns or less, 3 ns or less, or 1 ns or less) in order to improve the ability of the neutron detector to discriminate between neutrons generated at different times. The illustrated array of neutron detectors 140 can be used to determine the position of the detected neutron relative to the neutron source 120, as well as the time of flight of a neutron emitted from the neutron source 110. An interrogation region 160 in which an interrogated object 150 is positioned is located between the array of neutron detectors 140 and the neutron source 110.

The array of neutron detectors 140 and the alpha-particle detector 120 also help define the shape and size of the neutron beam emitted from the neutron source 110 that is used for neutron imaging. Although neutrons are emitted from the neutron source roughly isotropically, only a fraction of the emitted neutrons are time and directionally tagged and are useful for imaging purposes. In particular, the neutrons that are useful for imaging purposes comprise those neutrons that can be detected by the neutron detector 140 and whose associated alpha particles can be detected by the alpha-particle detector 120. The three-dimensional space traversed by these neutrons is referred to herein as the neutron beam, and typically forms a cone beam (e.g., cone beam 180) since the shape of the alpha-particle detector 120 is usually circular. Other beam shapes are possible, however, depending on the particular shape and configuration of the alpha-particle detector 120. If the alpha detector is subdivided into pixels, the total neutron beam is subdivided into an array of neutron beamlets of any desired shape depending on the subdivision of the alpha detector.

To illustrate the principles of the APNR method, FIG. 1 further illustrates two possible neutron paths. A first neutron path 130 travels through the interrogated object 150 and is detected at position 142 on the face of the array of neutron detectors 140. A second neutron path 132 also travels through the interrogated object 150 but is scattered or otherwise interacts in the object 150. The resulting scattered or fission neutron arrives at a position 144 on the array of neutron detectors 140. Because the scattered or fission neutron does not arrive at the correct time and/or position on the neutron detector, the scattered or fission neutron detected at position 144 can be ignored for purposes of creating a projection image of the interrogated object 150.

The configuration 100 further comprises an image processing system 170 coupled to the neutron detector 140 and the alpha particle detector 120. In certain embodiments, the image processing system 170 comprises a computer-based system (e.g., system comprising a computer processor, non-transitory memory, and non-transitory storage media) that executes image processing software. The image processing software can comprise, for example, computer-executable instructions stored on one or more non-transitory computer-readable media (e.g., volatile memory, non-volatile memory, or magnetic storage devices, such as hard drives) which when executed by a computer cause the computer to perform an image processing method (e.g., any of the image processing methods disclosed below).

FIGS. 2-6 illustrate an exemplary image processing method that can be performed by the image processing system 170. FIGS. 2-6 also show exemplary images that can be obtained as a result of using embodiments of the disclosed technology. For illustrative purposes, the exemplary image processing method is described in relation to the configuration shown in FIG. 2.

Figure 2:
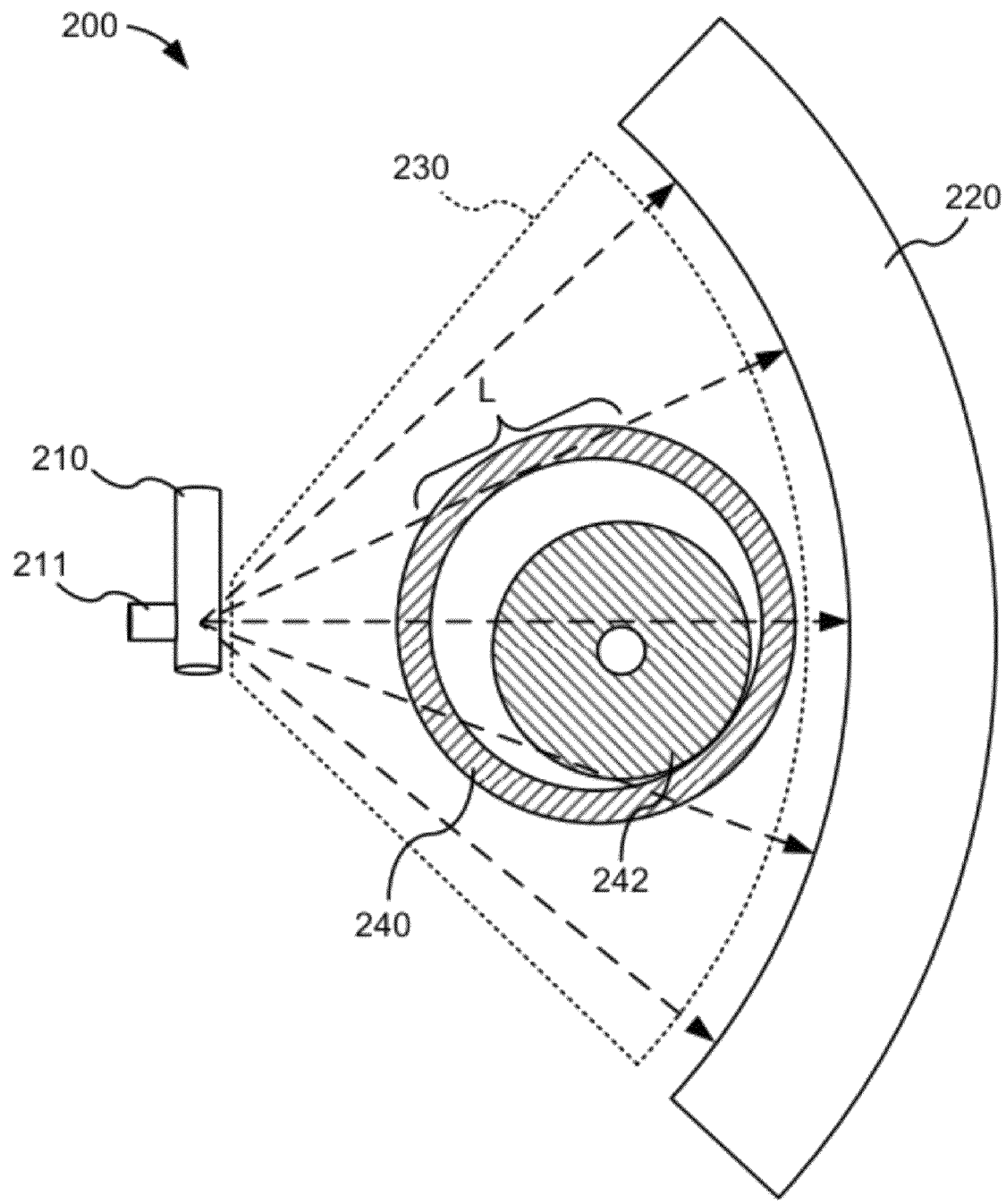
FIG. 2 is a schematic block diagram of a second APNR system that also uses an embodiment of the disclosed technology as an alpha particle detector.

FIG. 2 shows an APNR configuration 200 comprising a neutron generator 210, which is a sealed tube DT generator that has an associated alpha particle detector comprising an embodiment of the fiber optic face plate disclosed below with respect to FIGS. 6 and 7. The APNR configuration further comprises a two-dimensional array of neutron detectors 220 configured to have a semi-spherical shape. An interrogation region 230 is defined between the neutron generator 210 and the array of neutron detectors 210. The semi-spherical shape of the neutron detector array 220 allows each individual neutron detector of the array 220 to be equidistant from the neutron source in the neutron generator 210. In other embodiments, the neutron detector array 220 is flat, partially spherical, fan-shaped, or has some other shape. For example purposes, the objects being interrogated in the interrogation region 230 are a metal pipe 240 that conceals a puck-shaped plastic object 242 with a central hole.

To implement the exemplary image processing method, certain baseline measurements and images can be determined. For example, in order to establish the expected timeof-flight of the neutrons emitted from the neutron source, counts at each of the neutron detectors on the array of neutron detectors 220 can be captured with respect to the time from detection of the associated alpha particle at the corresponding alpha detector pixel (e.g., the alpha detector pixel that indicates neutron emission in the direction of a particular neutron detector).

Figure 3:
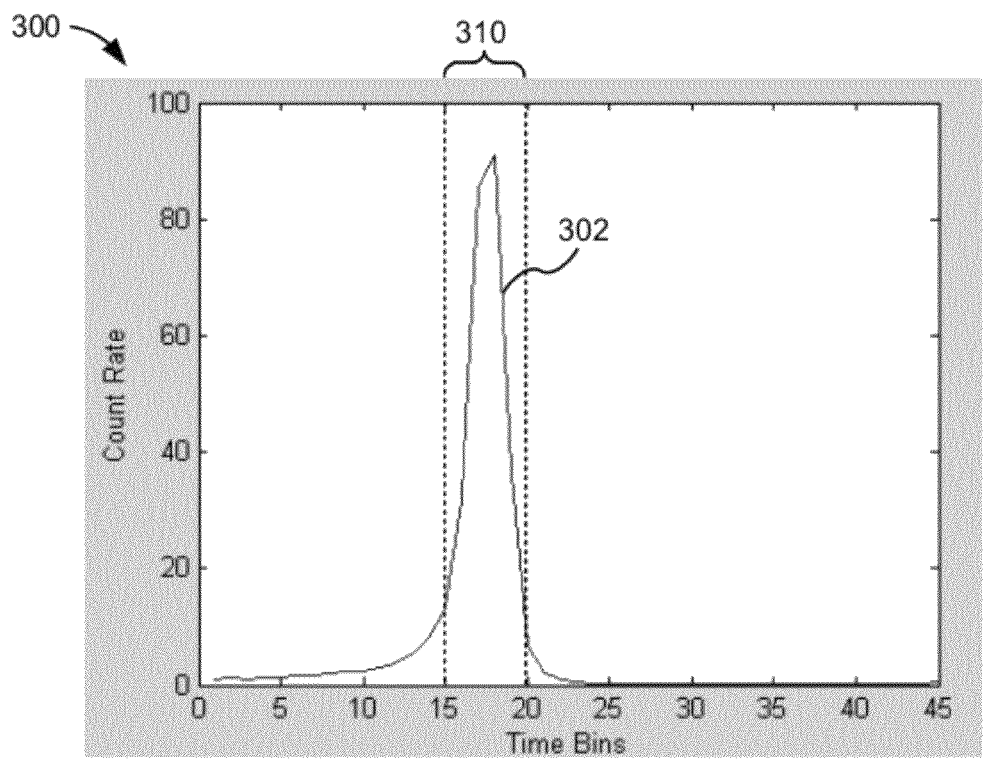
FIG. 3 is a time distribution of counts (after an alpha detector count) at a neutron detector from the APNR system of FIG. 2.

FIG. 3 is a representation 300 showing a plot 302 from the results from one such neutron detector. For the neutron detector associated with image 300, the plot 302 shows that the time-of-flight for a neutron is between about 15-20 nanoseconds from the time the associated alpha particle is detected at the corresponding alpha detector position. This information can be used to select the proper time period or time window (e.g., time window 310) in which to count a detected neutron as being the "tagged" neutron associated with a corresponding alpha particle detected at the alpha particle detector. The time window can comprise multiple time bins (or sampling periods) at which the neutron detectors operate. Further, the time window can have a variety of lengths relative to the observed peak. For any given interrogation period, the counts that are observed as falling within the selected time window with and without the object in place are collected and used to generate a projection image.

The exemplary imaging process also uses a normalization image $I_0$. In particular embodiments, the normalization image $I_0$ is the image across one or more (e.g., all) of the neutron detectors of the neutron detector array 220 when no object is present in the interrogation region. The image $I_0$ can comprise, for example, the count rate of neutrons at each neutron detector across the neutron detector array 220 during the appropriate time window for tagged neutrons.

A projection image can then be taken with the object in the interrogation region 230. The image taken with the object in the interrogation region 230 results in a signal I for a given neutron detector in the array of neutron detectors:

$$I = I_0 e^{-\mu L} \quad (2)$$

where $I_0$ is the normalization image for the given neutron detector, $\mu$ is the attenuation coefficient for the object being interrogated, and L is the path length through the object.

If there are n multiple materials between the neutron source and the neutron detector, then the projection image observed is known to be a summation in the exponent:

$$I = I_0 e^{-\Sigma_{i=0}^{n} \mu_i L_i} \quad (3)$$

Consequently, the projection image of the object I can be normalized using the normalization image $I_0$, resulting in the summation of attenuations:

$$\log\left(\frac{I}{I_0}\right) = -\sum_{i=0}^{n} \mu_i L_i \quad (4)$$

Figure 4:
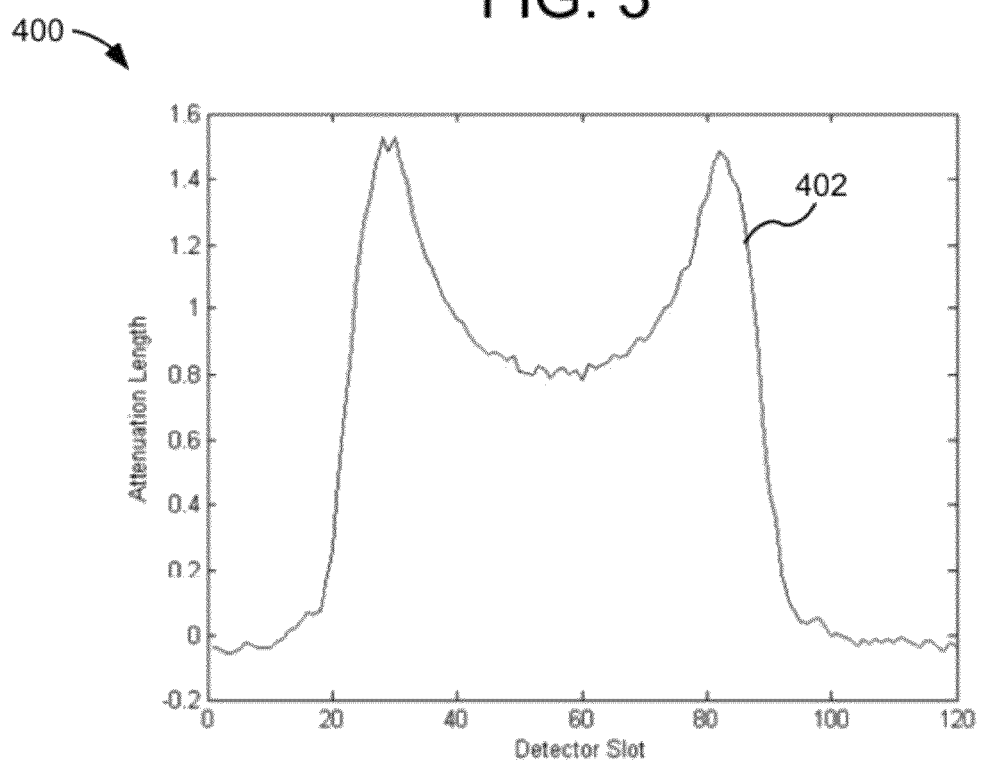
FIG. 4 shows the attenuation length as a function of lateral dimension from a row of neutron detectors of the APNR system of FIG. 2 at a height of the neutron detectors that is above the top of the puck-shaped plastic object within the metal pipe.

The attenuation lengths for each neutron detector in the neutron detector array can then be plotted together in order to form a two-dimensional projection image of the interrogated object. For example, FIG. 4 is an image 400 showing a plot 402 of attenuation lengths computed from a projection image of the lead pipe 240 at a height of neutron detectors above the top of the plastic object 242 in the neutron detector array 220 of the APNR configuration 200.

If additional neutron sources are present or if the object is rotated or otherwise moved (or if the neutron generator and the array of neutron detectors are rotated or otherwise moved) to a new position, normalization images and projection images of the object can be taken at many different orientations around the object. From the resulting projection images, three-dimensional reconstructions can be performed to arrive at a complete three-dimensional image or representation of the interrogated object. For example, in particular embodiments, a filtered back projection technique is used to construct a three-dimensional image from the projection images from the multiple neutron sources as well as the images from different orientations of the multiple neutron sources. In other embodiments, maximum likelihood estimation maximization ("MLEM") techniques, ordered subset estimation maximization ("OSEM") techniques, or other iterative reconstruction techniques are used. The three-dimensional image or representation of the interrogated object can be displayed to a user of the system (e.g., on a suitable display device) and/or stored on computer-readable media (e.g., non-transitory computer-readable media).

Figure 5:
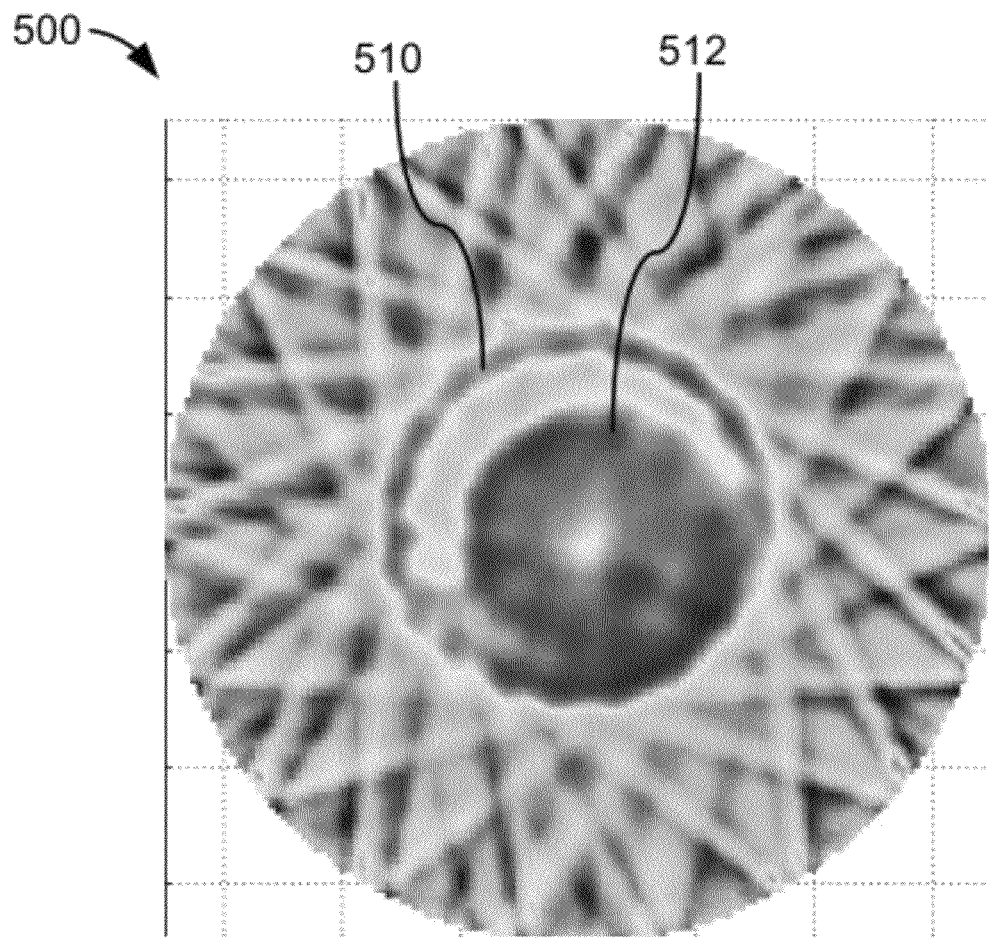
FIG. 5 is a slice through a reconstructed three-dimensional image of the object shown in FIG. 2. The image in FIG. 5 is generated from multiple projection images.

FIG. 5 is an image 500 of a slice through a three-dimensional reconstruction assembled from multiple projection images. In particular, the image 500 is a slice through the metal pipe 240 and the plastic object 242. The image 500 is a slice that is generated from the planar images obtained from interrogating the sides of the objects using an appropriate three-dimensional reconstruction technique. The image 500 clearly shows the lead pipe at region 510 and the plastic object at region 512. Image 500 also shows that the lead pipe and the plastic object can be differentiated from one another as a result of the neutron imaging.

III. Exemplary Embodiments of Particle Detectors Having Partially Doped Scintillation Fibers FIG. 6 is a schematic block diagram showing a first embodiment of a detection system 600 according to the disclosed technology. The detection system 600 can be used with embodiments of the APNR system discussed above, as well as with other system, as more fully disclosed below. The illustrated detection system 600 comprises a fiber optic face plate 610, a light guide 620, and a photomultiplier 630. In certain embodiments, the light guide 620 is not present. Furthermore, the fiber optic face plate 610, the light guide 620, and the photomultiplier 630 are shown in FIG. 6 as having a generally cylindrical shape, although they could have any other shape as well (e.g., square, rectangular, partially spherical or elliptical, or other such shape). In the illustrated configuration, the fiber optic face plate 610, the light guide 620, and the photomultiplier 630 are separated from one another by two small gaps 660, 662, which can be filled with optical coupling jelly or which represent a wall or other boundary (e.g., a wall of a sealed DT generator tube). In some embodiments, one or both of the illustrated gaps 660, 662 are absent.

Figure 6:
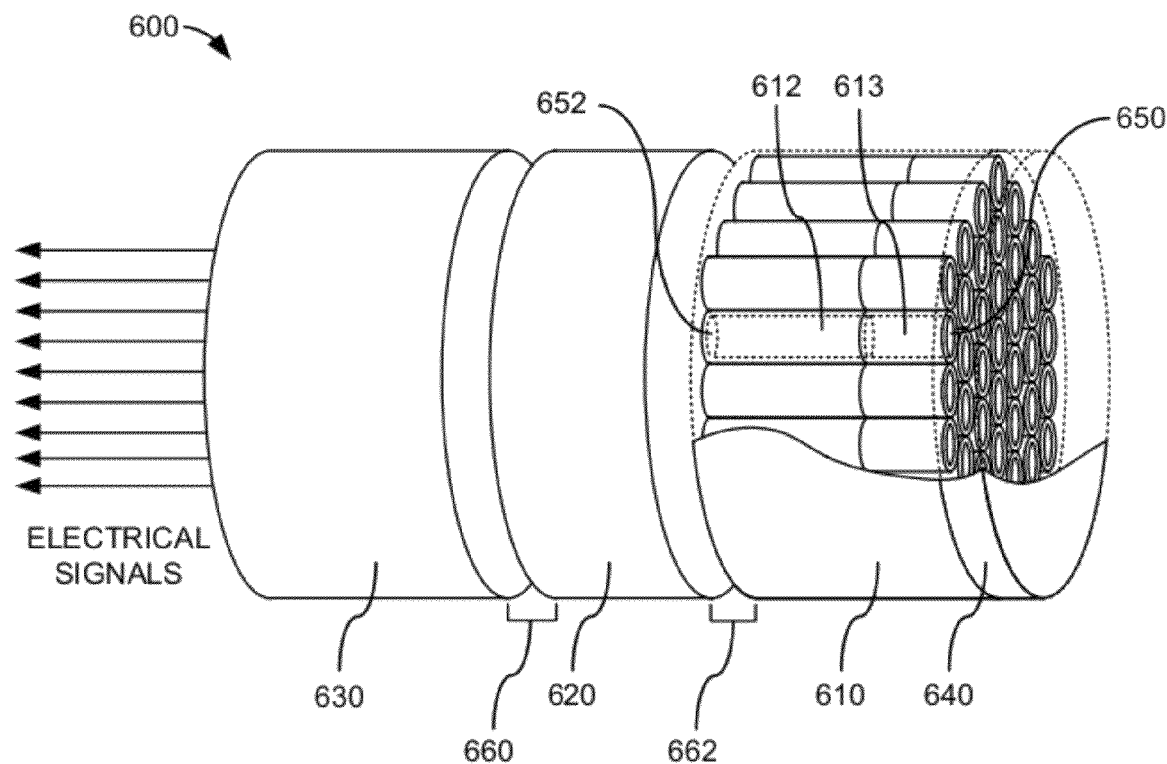
FIG. 6 is a schematic block diagram of a first exemplary particle detection system using an embodiment of the disclosed technology as a fiber optic face plate.

The fiber optic face plate 610 of the illustrated embodiment is formed from two or more optical fibers bundled together as shown in the partially cut-away region of FIG. 6. A representative optical fiber is shown as optical fiber 612. Although the optical fibers shown in FIG. 6 have a generally cylindrical shape, they could have any other shape (e.g., square, rectangular, polygonal, ellipsoidal, or any other such geometry). Additionally, the optical fibers can be arranged in a wide variety of arrangements that are appropriate for spatial detection (e.g., a two-dimensional array, spherical arrangement, and other such arrangement). The diameters of the two or more optical fibers can also vary, but in certain embodiments are 100 microns or less. The optical fibers are typically fibers formed of fused silica, but can be formed from other glass forming materials as well (e.g., fluorides, phosphates, germanates, or plastics). In some embodiments, for example, the optical fibers are also formed from single crystal fibers, such as yttrium aluminum perovskite ("YAP") fibers, yttrium aluminum garnet ("YAG") fibers, or aluminum oxide ($Al_2O_3$) fibers. In certain embodiments, the optical fibers are fused together to form a bundle using a bonding glass with a matching coefficient of thermal expansion and appropriate refractive index to preserve the light guiding properties of the fibers.

In the illustrated embodiment, one or more of the optical fibers are partially doped with one or more dopants selected to scintillate when incident with a neutron, charged particle, or other activating particle. For example, the representative optical fiber 612 includes a doped region 613. In the illustrated embodiment, the remaining length of the optical fibers is not doped with any selected dopant (e.g., the majority length of the optical fibers is undoped). The undoped length produces no light from particle interactions.

In some implementations, multiple dopants are used to create the doped region. For example, a first dopant in the doped region can interact with the target particle and thereby produce a secondary particle, and a second dopant in the doped region can interact with the secondary particle and create one or more photons through a scintillation process. In one exemplary implementation, for instance, the ends of the fiber are doped with $^6Li$, which produces alpha particles and tritons from slow neutrons, and with $Ce^{3+}$, which produces photons from interactions with alpha particles. The number, type, and depth of the dopants used will vary depending on the target particle. Further, the examples described herein should not be construed as limiting, as additional or alternative dopants can be used to create other cascades of interactions to produce photons within the optical fibers from a target particle (e.g., a beta particle or other charged particle). Additionally, in embodiments with multiple dopants, any two or more of the dopants can be in overlapping doped regions, partially overlapping doped regions (e.g., with the doped region for producing photons (or, alternatively, for interacting with the target particle) extending deeper than other doped regions), or non-overlapping doped regions (e.g., with the doped region for producing photons (or, alternatively, for interacting with the target particle) being located deeper than other doped regions).

In general, the one or more dopants and the depth of doping can be selected in view of the intended function and activating particle for which the optical fibers are targeted. In certain embodiments (such as the illustrated embodiment in which the optical fibers will be used as alpha particle detectors (e.g., in API applications)), the dopant is cerium (Ce). In specific implementations, the dopant is $Ce^{3+}$. In other embodiments, the dopant is one or more of europium (e.g., $Eu^{2+}$) or praseodymium (e.g., $Pr^{3+}$). In some embodiments (such as embodiments in which the optical fibers will be used as neutron particle detectors), the second dopant is lithium (e.g., $^6Li$) or boron ($^{10}B$). As noted above, the doped regions of the optical fibers can be further doped or otherwise combined or enriched with other materials that are selected to enhance the detection of the targeted activating particle. For instance, the doped region can be further doped with a dopant selected to produce photons from a secondary particle generated by a first dopant. For example, a region doped with lithium or boron to produce alpha particles from incident neutrons can be further doped with cerium, europium, or praseodymium to produce photons from the alpha particles.

In certain embodiments, both the optical fibers that form the bundle and the doping agent are inorganic. This allows the resulting fiber optic face plate to withstand high temperatures without losing its functionality. For instance, when sealed tube DT generators are manufactured, the tube and its components are baked to over 300° C. to reduce impurity content.

The depth to which the one or more optical fibers are doped can vary from implementation to implementation. In particular, the depth of doping will vary depending on the particle and the particle energy for which the optical fibers are targeted. Although the depth of doping can be of any size, in certain embodiments, the doped region has a depth (or length) of 1-100 microns. For optical fibers designed to scintillate with incident alpha particles, the depth of doping can be between 1-20 microns, and in certain desirable embodiments is between 5-10 microns.

A coating 640 is also shown in FIG. 6 and coats the scintillation face 650 of the fiber optic face plate 610. The coating 640 shown in FIG. 6 coats the entire scintillation face 650 of the fiber optic face plate 610. In other embodiments, however, the coating 640 only coats a portion of the face. For instance, in certain embodiments, the coating is applied so that it coats the individual ends of the optical fibers. In general, the coating 640 is configured to shield or prevent transmission of certain selected particle to the scintillation ends of the optical fibers. In certain embodiments, the coating is a coating of aluminum (or other suitable material) and prevents light or scattered tritons or deuterons from reaching the scintillation ends of the fibers. The coating can have a variety of thicknesses, but in certain embodiments is 1-5 microns, and in particular embodiments is 1.5 microns or less (e.g., 1 micron). The thickness of the coating can be varied so that the coating not only achieves the described shielding effects, but also operates to reflect photons generated within the optical fibers, thereby increasing the effective light output of the fibers.

In the embodiment illustrated in FIG. 6, the photomultiplier 630 is coupled to the non-scintillating face 652 (or end) of the fiber optic face plate 610 via a light guide 620. The photomultiplier 630 can be any position-sensitive photomultiplier. In some embodiments, the photomultiplier 630 has pixelated regions or other light-to-electric-signal conversion regions that have a size and orientation corresponding to the size and orientation of the optical fibers in the fiber optic face plate. In other embodiments, however, a light guide (such as light guide 620) or other light transmission system (such as the bundle of optical fibers shown in FIG. 7) is used to direct light from the non-scintillating face 652 of the fiber optic face plate 610 to corresponding pixelated regions or conversion regions of the photomultiplier 630. Examples of suitable photomultipliers include the photomultiplier tube assemblies available from Hamamatsu Photonics (e.g., the Hamamatsu 9500). Although a photomultiplier 630 is shown in FIG. 6, any light-to-electric-signal conversion system could be used.

As noted, embodiments of the detection system 600 can be used in an APNR system such as shown in FIG. 1. In such a system, or in any system in which the detection system 600 is used to detect alpha particles, the system can operate follows. An alpha particle passes through the coating 640 that covers the scintillation face 650 (or first end) of the optical fibers inside the vacuum-sealed DT generator. As noted, the coating 640 can be an aluminum layer (e.g., having a thickness of 5 microns or less) and can prevent light and scattered deuterium and tritium from the generator from reaching the scintillation regions of the optical fibers. The alpha particle stops in the scintillation region of one of the fibers and produces light (one or more photons). As noted, the scintillation region can be 5 to 10 microns long. In this example, the scintillation region is thin to minimize detection of X-rays that would otherwise produce low amplitude background counts. The thin scintillator is also relatively insensitive to gamma rays produced by neutrons from the generator and from background radiation.

The light propagates through the fiber to the non-scintillator face 652 (or end) of the fiber optic face plate 610. The light coming through the non-scintillator face 652 of the fiber optic face plate 610 is guided by the light guide 620 to the center of a pixel of the photomultiplier 630. The light then interacts with the photomultiplier 630, producing an electronic pulse that defines the time and location of the alpha detection, as described above. As noted, the light guide is not present in some embodiments.

Figure 7:
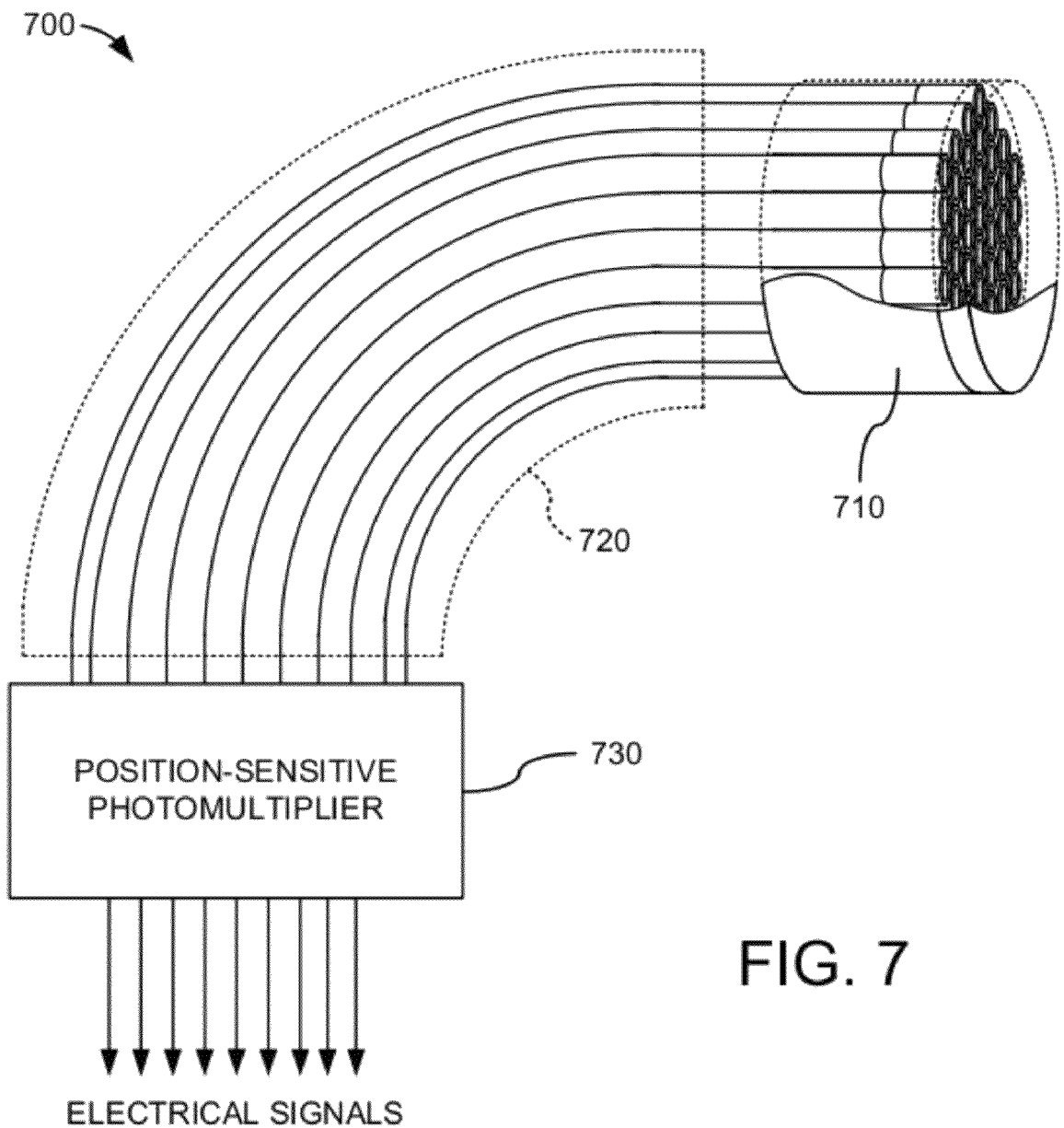
FIG. 7 is a schematic block diagram of a second exemplary particle detection system using another embodiment of the disclosed technology as a fiber optic face plate.

FIG. 7 is a schematic block diagram showing a second embodiment of a detection system 700 according to the disclosed technology. The detection system 700 comprises a fiber optic face plate 710 directly coupled to a photomultiplier 730. In this embodiment, the optical fibers of the fiber optic face plate extend out of the housing of the fiber optic face plate 710 and form a bundle of optical fibers 720. The bundle of optical fibers is routed directly to the input regions of the position-sensitive photomultiplier 730. As illustrated, the photomultiplier 730 generates electrical signals based on the light received. In an API application, the photomultiplier 730 can be coupled to an image processing system (e.g., any of the image processing systems described above), which performs a suitable image reconstruction technique. A wide variety of photomultipliers can be used as the photomultiplier 730. Suitable examples of such photomultipliers include the photomultiplier tube assemblies available from Hamamatsu (e.g., the H9500).

In both FIG. 6 and FIG. 7, the scintillating region is integrally formed with the light transmitting optical fibers of the faceplate. Thus, no separate scintillation device or plate is needed to perform particle detection. This integrated design provides a number of possible advantages, any one or more of which can be realized in embodiments of the disclosed technology.

For example, one possible advantage that can be realized in embodiments of the design illustrated in FIG. 6 or FIG. 7 is that the scintillation region exhibits reduced light dispersion. This reduction in light dispersion results from the integrated design of the optical fibers as well as the coating that can be applied to the scintillation end of the fibers. In general, the light output of the optical fibers increases as the thickness of the coating, which operates to reflect light at the first end of the optical fibers, increases. By contrast, in designs in which a separate scintillator is mounted to a fiber optic face plate, a gap exists between the separate scintillator and the optical fibers. Significant light loss occurs at this gap. In addition, the separate scintillator has a finite thickness through which light disperses in all directions. This creates an additional loss of light.

A further advantage that can be realized in embodiments of the design illustrated in FIG. 6 is that the scintillating region is integrated with (and in some embodiments, within) individual optical fibers. Thus, when scintillation occurs at a scintillation region as a result of an incident activation particle, the resulting light is concentrated within the single optical fiber whose scintillation region was excited. This concentration of light to a single optical fiber allows the bundle of optical fibers to have high spatial resolution, since the location of the incident particle can be identified and associated with an individual optical fiber. In certain embodiments, then, the possible resolution of the fiber optic face plate is the size or diameter of the optical fibers (e.g., 100 microns or less). By contrast, in designs in which a separate scintillator is mounted to a fiber optic face plate, the dispersion of light in the body of the separate scintillator typically causes the light to be incident on multiple optical fibers of the face plate. Thus, the spatial resolution of such a face plate is greatly improved.

A further advantage that can be realized in embodiments of the design illustrated in FIG. 6 or FIG. 7 is that as a result of the decreased light loss and the increased resolution, the number of false target particle detections (e.g., false alpha detections) can be reduced while the number of real target particle detections (e.g., real alpha detections) can be increased.

A further advantage that can be realized in embodiments of the design illustrated in FIG. 6 or FIG. 7 is that the scintillating region can be designed to more precisely target an activating element. For instance, the depth of the doping of the optical fibers can be controlled with high precision, resulting in scintillation regions that have a much higher alpha detection rate and lower false alpha detection rate than conventional scintillators. Such scintillation regions are also less sensitive to background radiation or other noise (e.g., X-rays or gamma rays) because they are so thin. The coating (e.g., coating 640) that is included in some embodiments of the disclosed technology can also enhance the sensitivity to real target particle detections and reduce sensitivity to false target particles, background radiation, and/or other noise.

A further advantage that can be realized in embodiments of the design illustrated in FIG. 6 or FIG. 7 is the speed with which the fiber optic face plate comprising partially doped optical fibers can operate. On account of the integrated design, embodiments of the disclosed fiber optic face plate can operate with a time resolution of 10 nanoseconds or less, such as 2 nanoseconds or less or 1 nanosecond or less. Thus, when embodiments of the disclosed technology are used in API applications, a time of flight event can be resolved to less than 2 nanoseconds, or within about 1 nanosecond.

A further advantage that can be realized in embodiments of the design illustrated in FIG. 6 or FIG. 7 is that the integration of the scintillating regions with the optical fibers creates a simpler system overall. As a result, the scintillating fiber optic face plate is durable and less susceptible to failure or misalignment such as may occur in systems in which a separate scintillator is mechanically affixed to a face place. This feature can be particularly advantageous when the fiber optic face plate is used in sealed environments, where repairs are time-consuming, costly, and potentially not feasible.

In the embodiments illustrated in FIG. 6 and FIG. 7 and discussed above, the spatial resolution is generally defined by the size of the fibers and how many are bundled together and directed to the sensitive area of the pixels of the photomultiplier. For example, certain embodiments of the disclosed technology have a spatial resolution of 100 microns or less. When embodiments of the disclosed fiber optic face plate are used in API systems (such as the APNR system of FIG. 1), however, the spatial resolution of the fiber optic face plate may be limited by other factors in the system. For example, the neutron cone size corresponding to a given alpha pixel depends also on the neutron production spot size in the DT generator. Reducing the pixel size in the alpha detector beyond some limit is typically not beneficial unless the neutron production spot size is reduced also. However, there is typically a limit to the amount the neutron spot size of the DT generator can be reduced due to heating of the target. Target cooling can be used to allow more beam energy to be incident on the target without damage.

Figure 8:
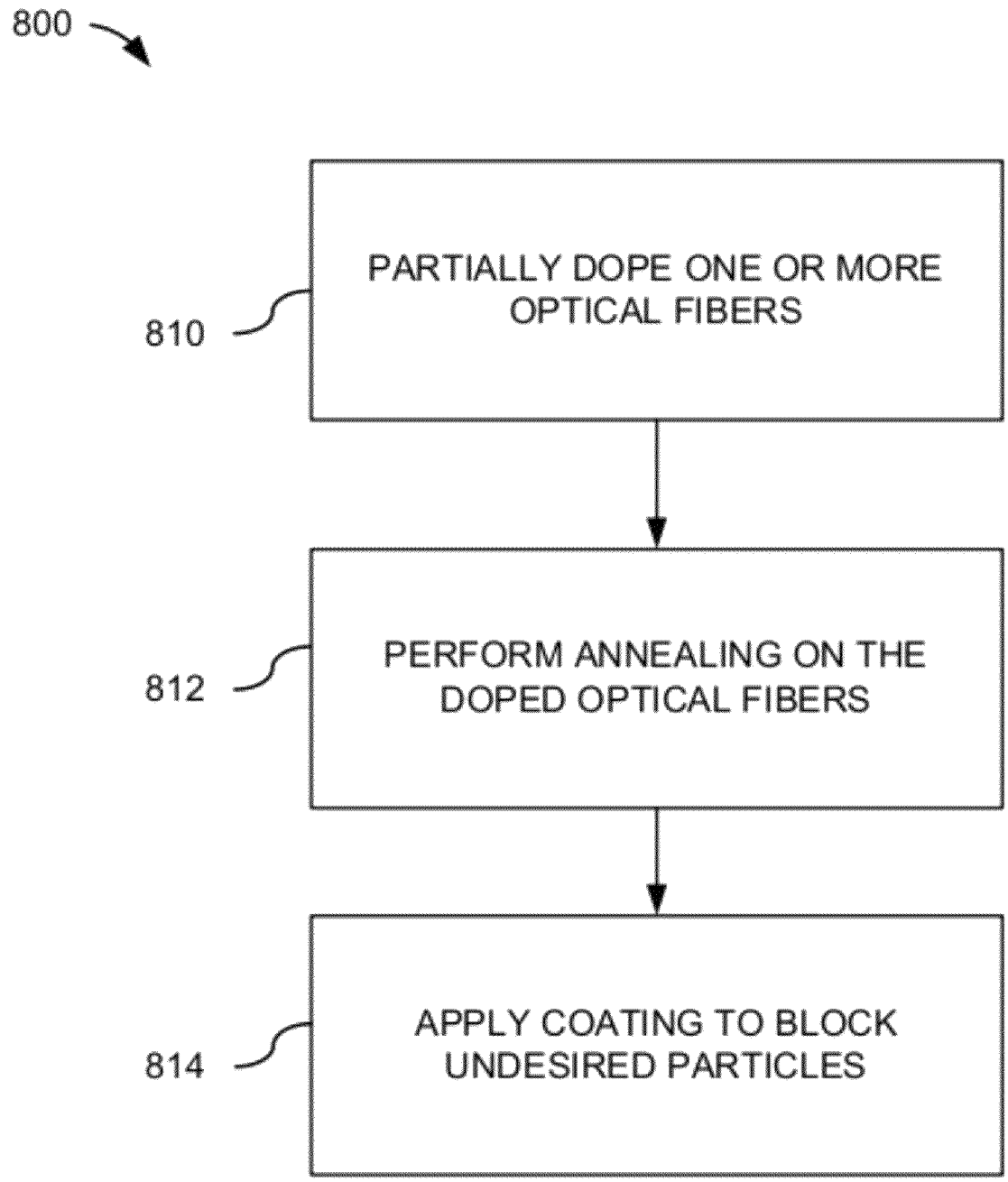
FIG. 8 is a flowchart illustrating a method of manufacturing partially doped optical fibers according to embodiments of the disclosed technology.

FIG. 8 is a flowchart 800 illustrating an exemplary method for manufacturing a fiber optic face plate, such as the fiber optic face plate illustrated in FIG. 6 or FIG. 7. The illustrated method should not be construed as limited, however, as other manufacturing techniques can be used to create embodiments of the disclosed technology. Additionally, any one or more of the illustrated acts can be performed alone or in various combinations and subcombinations with one another or with other method acts.

At 810, a portion of one or more optical fibers are doped. For instance, in certain embodiments, less than a majority of the optical fiber is doped, and in some embodiments, doping is performed on a short end portion of the optical fibers (e.g., an end portion of the optical fibers that is 50 microns or less, 20 microns or less, or 10 microns or less) with a remainder of the optical fibers being undoped. The doping can be performed using a variety of techniques, but in certain embodiments is performed by high-energy ion implantation. More specifically, high-energy ion implantation can be used to implant activator ions to form a scintillation region on the end of the optical fibers. The activator ions can include one or more of $Ce^{3+}$, $Eu^{2+}$, $Pr^{3+}$, or other trivalent ions. Other additional or alternative activator ions can also be used depending on the particle for which the optical fibers are to be functionalized. In embodiments in which multiple dopants are implanted, the dopants can be applied in consecutive order (e.g., the dopant selected to generate photons from a secondary particle can be implanted first, followed by the dopant selected to interact with the target particle and thereby generate the secondary particle). In general, the goal of the implantation process is to form a scintillation region on the optical fiber whose depth corresponds to the range of the incident particles (e.g., incident alpha particles). The depth of the ion implantation region, and thus the size of the scintillation region, can be controlled by the implantation energy. In other words, by varying the implantation energy of the implantation accelerator, various implantation depths can be produced. If single crystal optical fibers are used to form the bundle of optical fibers (e.g., $Al_2O_3$ fibers, yttrium aluminum perovskite ("YAP") fibers, yttrium aluminum garnet ("YAG") fibers, or other such single crystal optical fibers), ion implantation along a "channeling" direction can be used to further increase the maximum depth of the ion implantation. Also, before ion implantation is performed, the ends of the optical fibers can be polished. A controlled diffusion process (e.g., controlled thermal diffusion) can be used as an alternative to ion implantation in situations whether deeper doping depths are desired (e.g., depths of greater than 10 microns).

At 820, an annealing process is performed on the one or more doped optical fibers. The annealing process can be performed after or during the doping of the optical fibers. The annealing process is performed to uniformly distribute the doping atoms. For instance, a controlled diffusion process can be performed. In some instances, annealing is used to increase the depth of implantation (e.g., to create a doping region having a size greater than 50 microns).

At 830, a coating is applied to the doped ends of the optical fibers. For example, the coating can be a metal or other element selected to prevent passage of certain particles (e.g., gamma rays, X-rays, tritons, deuterons, or other undesired particles, depending on the application). In particular implementations in which the doped optical fibers are used for alpha particle detection (e.g., as part of an API system), the optical fibers can be coated with aluminum to prevent light or scattered tritons or deuterons from reaching the scintillation end of the optical fibers. This coating may be applied using physical vapor deposition, chemical deposition, or other standard coating methods. Although the thickness of the coating will vary from implementation to implementation, a coating of 5 microns or less is used in some embodiments. In certain desirable implementations, a coating of 1 micron or less is used.

IV. Further Applications for Embodiments of the Disclosed Technology

In general, the disclosed particle detector embodiments and methods for manufacturing such particle detectors can be adapted for use in any application where incident charged particles are desirably detected with high spatial resolution. Furthermore, although the discussion above primarily concerned the detection of alpha particles, embodiments of the disclosed technology can be modified to detect other particles (e.g., beta particles, neutrons or X-rays) that by interaction with atoms in the optical fibers will produce light. For instance, the doping agent and doping depth can be selected and adjusted as appropriate depending on the target particle for which the detector is designed. Similarly, the thickness of the coating on the fiber optic face plate is tailored to the type of radiation being detected.

Figure 9:
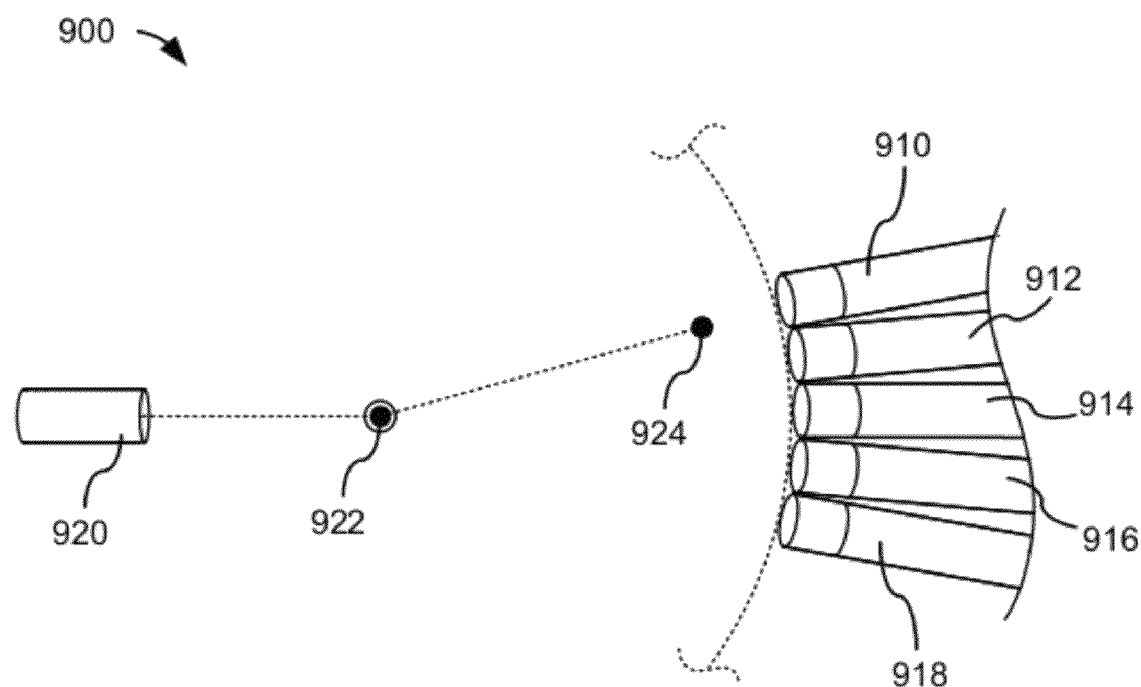
FIG. 9 is a schematic block diagram of a cold neutron scattering system using an embodiment of the disclosed technology as a radiation detector.

For example, embodiments of the disclosed technology can be used in neutron scattering systems (e.g., cold neutron scattering experiments, such as those performed at facilities like the Spallation Neutron Source ("SNS") or the High Flux Isotope Reactor ("HFIR"). An example configuration for such a system is illustrated in FIG. 9. In particular, FIG. 9 shows a portion of a scattered neutron detection system 900 in which partially doped optical fibers 910, 912, 914, 916, 918 are aligned in a spherical arrangement around a scattering origin. The scattering origin corresponds to the location of a scattering target 922 upon which neutrons (e.g., cold neutron 924) are impinging. As illustrated, the path of the cold neutron 924 extends from a neutron source 920 to the scattering target 922, where it is potentially scattered along a new path and incident with one of the partially doped optical fibers 910, 912, 914, 916, 918. The scattered neutron 924 will then interact with the scintillation region of the corresponding optical fiber, thereby generating light (one or more photons) that propagates to an opposite end of the activated optical fiber. As with the embodiments described above with respect to FIGS. 6 and 7, the ends of the optical fibers can be communicatively coupled to a photomultiplier (e.g., a pixelated photomultiplier or position-sensitive photomultiplier) or other light-to-electrical-signal converter (e.g., via a light guide or bundle of fibers). The location of the scattered neutron can then be determined through appropriate processing (e.g., implemented using computer-executable instructions executed by a computer and stored on a non-transitory computer-readable medium). Although only four partially doped optical fibers 910, 912, 914, 916, 918 are shown, it should be understood that additional partially doped optical fibers can be included in the system 900 and arranged to provide a suitable detecting surface that provides positional detection of a scattered neutron with high spatial resolution. The partially doped optical fibers 910, 912, 914, 916, 918 can be manufactured using any of the techniques discussed above. However, in order for the optical fibers to scintillate upon impingement by a neutron, the one or more doping agents and/or doping depths can be modified. In certain embodiments, for example, multiple doping agents are used: a first doping agent to interact with an incident neutron and produce a secondary particle, and a second doping agent to interact with the secondary particles produced and generate one or more photons. In particular embodiments, the first doping agent is lithium (e.g., lithium-6 ($^6Li$)) or boron (e.g., boron-10 ($^{10}B$)), and the second doping agent is cerium (e.g., $Ce^{3+}$), europium (e.g., $Eu^{2+}$) or praseodymium (e.g., $Pr^{3+}$). In neutron absorption in $^6Li$, for example, a triton and alpha particle are produced. These particles will travel a short distance in the glass before they are stopped and produce light by scintillating via the second doping agent. The neutron absorption cross section of $^6$Li at 0.0252 eV is 945 barns. The size of the scintillation region on a fiber designed to detect neutrons will typically depend on the absorption cross section, the number of $^6$Li atoms per cubic centimeter, and the energy of the neutrons. Cold neutrons typically vary in energy from $3\times10^{-7}$ to $5\times10^{-5}$ eV. For a glass of density of 2.5 g/cm$^3$, with 6.6% Li and with 95% of $^6$Li, about 95% of the neutrons (with energy=$5\times10^{-5}$ eV) will be absorbed in 53 microns of material. However, for cold neutron energy of $3\times10^{-7}$ eV, the neutron cross section is much higher and the thickness to absorb 95% of the neutrons is about 10 microns. Thus, in certain embodiments, the doping depths in the optical fibers is between 10 and 60 microns).

For these larger depths (e.g., of 10 microns or greater, or 50 microns or greater) ion implantation may not be sufficient to achieve the desired doping depths. In such situations, a diffusion process can be used to achieve the desired doping depths. For example, one exemplary method of introducing activator ions into the end of an optical fiber comprises depositing activator ions (e.g., $^6$Li or $^{10}$B) on the end of one or more optical fibers and then thermally diffusing the activator ion into the fiber end. The depth of the resulting scintillation region can be controlled by using an appropriate combination of thermal diffusion temperature and time. The activator ion can be deposited on the fiber end in either metallic, oxide, halide or other chemical form. Radial implantation could also be used. In certain embodiments, this diffusion method is used in conjunction with either single or multiple ion implantations.

The thickness of the coating that covers the scintillation end can also be modified for neutron detection applications. For example, the coating can be thicker than alpha-particle detection applications because neutrons can more easily penetrate the coating. For example, the coating can have a thickness greater than 5 microns (e.g., a thickness of 5-100 microns). This increased thickness also improves the reflectivity of photons within the fibers, making light generation in the fibers more efficient.

In FIG. 9, the scintillating region is integrally formed within the optical fibers. This integrated design provides a number of possible advantages, any one or more of which can be realized in implementations of the disclosed technology used for cold neutron scattering applications. As above, the one or more possible advantages that can be realized include a simpler design, small spatial light dispersion in the scintillator, concentration of light into single fibers, high spatial resolution for cold neutron detection (e.g., 100 microns or less), improved light output from the neutron reaction at the output side of the optical fibers, lower false detection rate, higher real detection rate, low sensitivity to X-rays, low sensitivity to gamma rays, or nanosecond or less time resolution.

Having illustrated and described the principles of the illustrated embodiments, it will be apparent to those skilled in the art that the embodiments can be modified in arrangement and detail without departing from such principles. For example, any of the disclosed system can be used in conjunction with a gamma-ray interrogation system or beta particle detection system. Additionally, any of the disclosed embodiments can be used with or adapted for use with molecular scattering systems, such as those used to develop clothing, medical materials, electronic materials, or any other new material. In such systems, the number of partially doped optical fibers, or size of detection systems using such partially doped optical fibers may be fairly large. In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

What is claimed is:

1. A particle detection system, comprising:
    a plurality of optical fibers having first ends and second ends opposite the first ends, the optical fibers comprising doped regions at the first ends and non-doped regions adjacent to the doped regions, the doped regions of the optical fibers comprising a dopant having a dopant depth, the dopant and dopant depth being selected to scintillate upon interaction with a single target particle type, and to thereby generate one or more photons, the optical fibers being further arranged to form a detection surface for detecting a spatial location on the detection surface where the single target particle type is detected; and
    a pixelated photomultiplier communicatively coupled to the plurality of optical fibers, the pixelated photomultiplier being configured to produce an electrical signal in response to the one or more photons indicative of the spatial location on the detection surface where the single target particle type is detected.

2. The particle detection system of claim 1, wherein the photomultiplier is communicatively coupled to the optical fiber via a light guide or via a direct coupling.

3. The particle detection system of claim 1, further comprising a coating deposited over the first end of the optical fibers, the coating being configured to block transmission of one or more untargeted particles.

4. The particle detection system of claim 3, wherein the coating is aluminum and has a thickness of 5 microns or less.

5. The particle detection system of claim 1, wherein a depth of the doped region of the optical fibers is 50 microns or less.

6. The particle detection system of claim 1, wherein the doped region comprises multiple dopants.

7. The particle detection system of claim 1, wherein at least one dopant of the doped region of the optical fiber is one of cerium, europium, or praseodymium, and wherein the single target particle type is an alpha particle.

8. The particle detection system of claim 7, wherein a depth of the doped region is 20 microns or less.

9. The particle detection system of claim 1, wherein at least one dopant of the doped region is one of lithium or boron, and wherein the single target particle type is a neutron.

10. The particle detection system of claim 1, wherein a first dopant of the doped region is one of cerium, europium, or praseodymium, and a second dopant of the doped region is one of lithium or boron.

11. The particle detection system of claim 10, wherein a depth of the doped region is between 20 and 100 microns.

12. The particle detection system of claim 1, wherein the single target particle type is an alpha particle, a beta particle, or a neutron.

13. An associated particle imaging system comprising the particle detection system of claim 1.

14. A neutron detection system comprising the particle detection system of claim 1.

15. A beta particle detection system comprising the particle detection system of claim 1.

16. The particle detection system of claim 1, wherein the dopant and dopant depth are further selected to scintillate upon interaction with a particle of the single target particle type having a selected particle energy.

17. A neutron radiography system, comprising:
    a neutron source;

one or more neutron detectors positioned to detect at least some of the neutrons generated by the neutron source;

an interrogation region located between the neutron source and the one or more neutron detectors; and an alpha particle detector configured to detect alpha particles associated with neutrons generated by the first neutron source, the alpha particle detector comprising the particle detection system of claim 1.

18. The system of claim 17, wherein the doped regions of the optical fibers of the particle detection system form alpha particle scintillation regions.

19. The system of claim 18, wherein a majority of the bodies of the optical fibers are undoped.

20. The system of claim 18, wherein the doped regions of the optical fibers are doped with one or more of cerium, europium, or praseodymium.

21. The system of claim 17, wherein the alpha particle detector has a spatial resolution of 100 microns or less.

22. The system of claim 17, wherein the alpha particle detector has a timing resolution of 2 nanoseconds or less.

23. The system of claim 17, wherein the alpha particle detector further comprises a coating configured to prevent transmission of light and scattered accelerated particles to the doped regions of the optical fibers.

24. The system of claim 17, wherein the alpha particle detector does not include a scintillating element separable from the optical fibers.

25. The system of claim 17, wherein the pixelated photomultiplier is communicatively coupled to the optical fibers through a light guide or a direct coupling.

26. The neutron radiography system of claim 17, further comprising a computer coupled to the pixelated photomultiplier and programmed to compute a direction of travel of a neutron based on the spatial location on the detection surface where an associated alpha particle is detected.

27. A neutron scattering system, comprising:

a neutron source;

a scattering target positioned in a path along which neutrons from the neutron source travel;

one or more neutron detectors positioned to detect one or more scattered neutrons scattered by the scattering target, the one or more neutron detectors comprising the particle detection system of claim 1.

28. The neutron scattering system of claim 27, wherein the doped regions of the optical fibers of the particle detection system are doped with two or more dopants, and wherein the two or more dopants comprise a first dopant selected to generate a secondary particle upon interaction with the incident neutron and a second dopant selected to generate a photon upon interaction with the secondary particle.

29. The neutron scattering system of claim 28, wherein the first dopant is one or more of lithium or boron, and the second dopant is one or more of cerium, europium, or praseodymium.

30. The system of claim 27, wherein a majority of the bodies of the optical fibers of the particle detection system are undoped.

31. The system of claim 27, wherein the first ends of the optical fibers of the particle detection system are covered by a coating that permits transmission of neutrons and reflects photons generated within the bodies of the optical fibers.

* * * * *